United States Patent [19]
Roberts et al.

[11] Patent Number: 5,874,188
[45] Date of Patent: Feb. 23, 1999

[54] FORMING PIGMENT COLOR FILTER ARRAYS

[75] Inventors: Luther C. Roberts, Rochester; Elaine R. Lewis, Churchville; Sharlene A. Wilson, Seneca Falls; David L. Losee, Fairport, all of N.Y.

[73] Assignee: Eastman Kodak Company, Rochester, N.Y.

[21] Appl. No.: 14,856

[22] Filed: Jan. 29, 1998

[51] Int. Cl.⁶ .................................. G02B 5/20; G03F 7/00
[52] U.S. Cl. .................................. 430/7; 216/24; 503/227
[58] Field of Search .................. 430/7; 216/24; 503/227

[56] References Cited

U.S. PATENT DOCUMENTS

| | | |
|---|---|---|
| 4,764,670 | 8/1988 | Pace et al. . |
| 4,793,692 | 12/1988 | Kamio et al. ........................ 349/106 |
| 4,876,167 | 10/1989 | Snow et al. . |
| 5,246,803 | 9/1993 | Hanrahan et al. . |
| 5,576,265 | 11/1996 | DeBoer et al. . |
| 5,756,240 | 5/1998 | Roberts et al. ........................ 430/7 |

*Primary Examiner*—John A. McPherson
*Attorney, Agent, or Firm*—Raymond L. Owens

[57] ABSTRACT

A method of making a color filter array of uniformly thick organic pigments on a first substrate includes coating an adhesion promoting layer over the first substrate; coating the adhesion promoting layer with an intermediate layer; coating the intermediate layer with a photoresist layer; and exposing and developing the photoresist layer to form an-array of first openings. The substrate further includes etching the intermediate layer, using the photoresist layer as a mask, to form an array of second openings in the intermediate layer which are wider than the corresponding first openings in the photoresist layer; depositing an organic pigment layer on the photoresist layer; lifting off the photoresist layer and overlying organic pigment layer; and removing the intermediate layer, leaving the organic pigment layer in the position of the second openings.

9 Claims, 4 Drawing Sheets

FORMING PIGMENT COLOR FILTER ARRAYS

CROSS REFERENCE TO RELATED APPLICATIONS

The present invention is related to commonly assigned U.S. patent application Ser. No. 08/788,108 by Roberts, et al., entitled "Making Color Filter Arrays By Transferring Two Or More Colorants Simultaneously"; U.S. patent application Ser. No. 08/788,532 by Roberts, et al., entitled "A Method Of Making A Color Filter Array by Colorant Transfer And Etch"; U.S. patent application Ser. No. 08/787,732 by Roberts, et al., entitled "Method Of Making Color Filter Arrays By Colorant Transfer Using Chemical Mechanical Polishing"; U.S. patent application Ser. No. 08/789,590 by Roberts, et al., entitled "Making Color Filter Arrays By Transferring Colorant Material"; and U.S. Pat. No. 5,688,551 by Littman, et al, entitled Method of Fonning an Organic Electroluminescent Display Panel". The disclosure of these related applications is incorporated herein by reference.

FIELD OF THE INVENTION

This invention relates to methods of making pigment color filter arrays.

BACKGROUND OF THE INVENTION

Color filter arrays can be provided by a number of different techniques. For example, dyes can be imbibed into deposited and patterned layers of mordant material. See, for example, U.S. Pat. No. 4,764,670 to Pace et al., and U.S. Pat. No. 4,876,167 to Snow et al., which describe such a process. This process suffers from several problems, such as the need to control the thickness of the mordant material layer and to precisely control the amount of dye used to achieve the appropriate color. An additional problem associated with this process is that the dye receiving layers swell upon the introduction of dyes, limiting the smallest dimension which can be attainable for use of very small filter elements. Another problem with this process is that dyes are susceptible to fading on exposure to light or heat.

Another method for making color filter arrays is by the transfer of dyes from a donor sheet into a receiving layer in a receiver. See, for example, commonly assigned U.S. Pat. No. 5,576,265 to DeBoer et al. which describes such a process. One problem with this process is that the dyes spread within the dye receiving layer in a receiver, resulting in loss in edge sharpness of the filter elements.

Alternatively, different layers of material with different indices of refraction can be deposited to form dichroic filters. See for example U.S. Pat. No. 5,246,803 to Hanrahan, et al., which describes such a process. One problem with the dichroic process is the complexity of forming multiple layers of different compositions and controlled thickness. Such a process requires precise control of a sputtering process in a high vacuum chamber, and suffers from the need to clean the vacuum chamber frequently to remove materials which build up on the interior surfaces and fixtures in the chamber.

An alternative to making color filter arrays from dyes or dichroic filters is to use organic pigments, which are more stable to light and heat than dyes, and are easier to process than dichroics, requiring no more than two or three layers. Organic pigments are thermally stable enough to be evaporated in a partial vacuum, and applied as a coating in what is known as physical vapor deposition (PVD), using a system such as that depicted in FIG. 1. A substrate 102 is positioned adjacent to an aperture mask 104. The aperture mask provides an aperture over a portion of the substrate. The material which is to provide the coating is placed into a source boat 100, which is heated by passing an electric current through it. Alternatively, the source boat can be heated by the application of radiant heating from a suitably placed heat source. Upon being heated under reduced pressure, the material vaporizes and travels from the source, impinging on mask 105. The portion of material vapor which passes through the opening in mask 105 travels along the lines 103, and between those lines, depositing on the substrate 102 and mask 104.

There are a number of problems associated with PVD using a conventional source boat. In certain cases, it is difficult to control the thickness and uniformity of the material deposited on the substrate, especially when it is desired to deposit more than one material simultaneously, such as may be the case in making a color filter array in order to fine tune the color produced. Such a co-deposition process typically requires simultaneous control of the evaporation rates from multiple source boats. Also, the use of appropriately placed sources or masks or moving substrate fixtures are typically required. In addition, the material may deposit on the masks and vacuum fixtures to such a degree that it flakes off, creating undesirable contamination and waste of the evaporant material, and requiring frequent clean-up. Further, the moving fixtures may generate undesirable particulate materials which may cause contamination of the substrate.

Some other problems with the PVD process as it is normally practiced are the need to use a large source-to-substrate spacing, which requires large vacuum chambers and large pumps to reach a sufficient vacuum, and the need for larger masks which cause low material utilization and build-up on the masks with the concomitant contamination problems. Very specific off-axis source location relative to the substrate, which is sometimes needed for uniform coating, also causes very poor material utilization. Still further, source replenishment problems exist for coating multiple substrates in one pump-down. In addition, when multiple layers are deposited, the process needs to be carefully monitored for the thickness of layers in the multiple colorant coatings in multiple cycles.

SUMMARY OF THE INVENTION

It is an object of the present invention to provide color filter arrays which are stable to light and heat and which obviate the above difficulties by providing uniformly thick pigment over the substrate, and is of low cost and high quality.

This object is achieved by a method of making a color filter array of uniformly thick organic pigments on a first substrate, comprising:
a) coating an adhesion promoting layer over the first substrate;
b) coating the adhesion promoting layer with an intermediate layer;
c) coating the intermediate layer with a photoresist layer;
d) exposing and developing the photoresist layer to form an array of first openings;
e) etching the intermediate layer, using the photoresist layer as a mask, to form an array of second openings in the intermediate layer which are wider than the corresponding first openings in the photoresist layer;

f) depositing an organic pigment layer on the photoresist layer;

g) lifting off the photoresist layer and overlying organic pigment layer; and h) removing the intermediate layer, leaving the organic pigment layer in the position of the second openings.

In another embodiment, the present invention provides a method of making a color filter array of organic pigments on a first substrate comprising the method given above wherein the organic pigment is heat transferable and wherein step f) further includes the steps of depositing at least one such heat transferable material over a second substrate, positioning the deposited heat transferable layer in transferable relationship with but spaced from the photoresist layer on the first substrate, and heating the deposited heat transferable layer sufficiently to cause organic pigment to transfer to the photoresist layer.

It is a feature of the present invention that it can be used in applications such as liquid crystal light emitting diode displays or image sensors where a uniformly thick pigment layer is useful. Advantages of this method include the ability to form light and heat stable color filter arrays with tuned colors by codeposition of a plurality of colorant materials in a single step, along with the ability to pattern the pigment layers to form an array of pigment elements. In addition, the present invention provides for an evaporative purification of the pigment during the preparation of the heat transferable pigment layer and the effective utilization of evaporant materials with high quality uniformity over a large area. Other advantages include precise control of layer thickness, lower maintenance of deposition vacuum cambers, and minimal monitoring for the deposition process. Still further, it offers the ability to coat at higher pressures and in smaller vacuum chambers which permit faster cycle time and the use of lower-cost vacuum equipment than for standard PVD techniques.

DETAILED DESCRIPTION OF THE INVENTION

Figure 1:
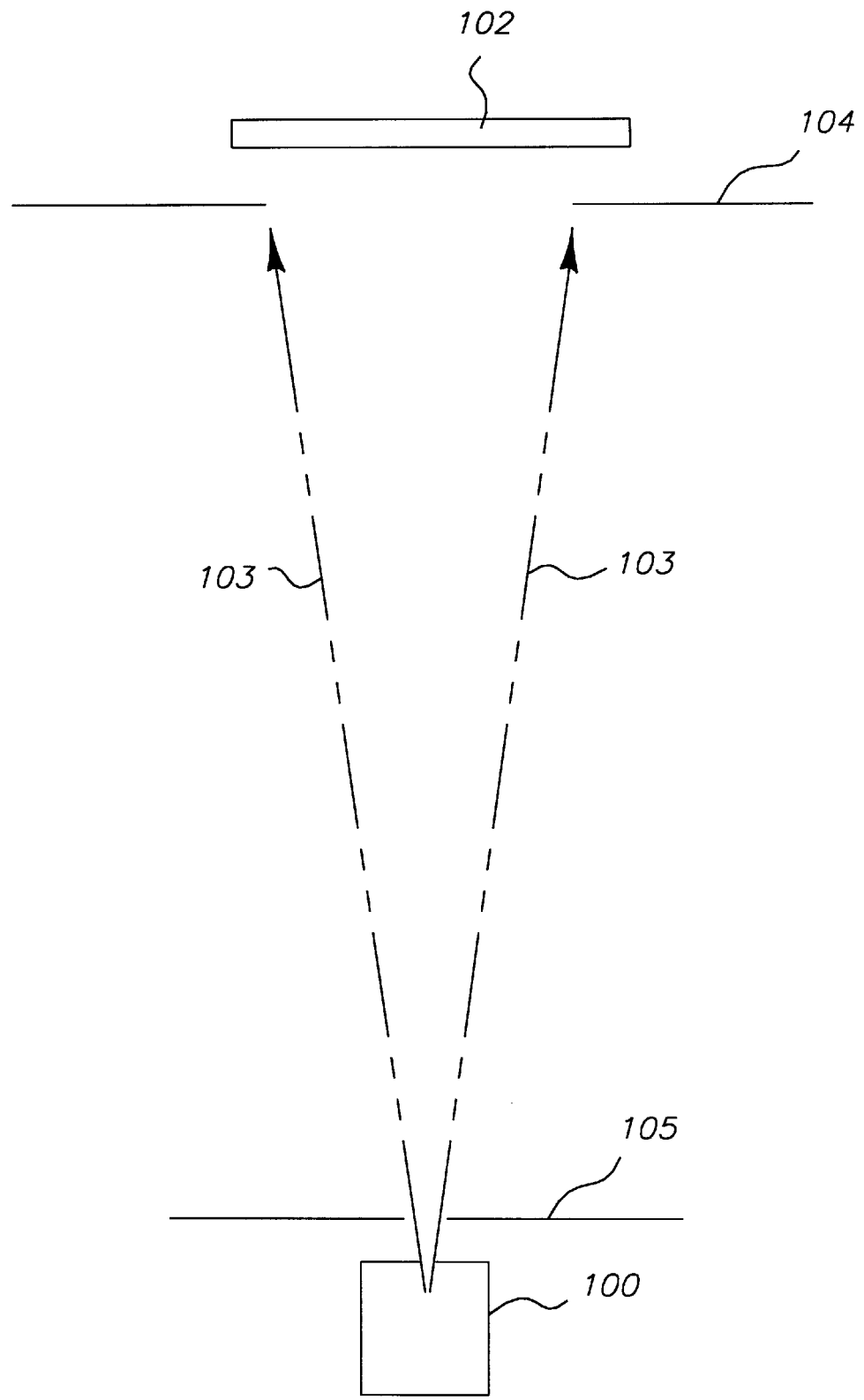
FIG. 1 shows a typical system for conventional physical vapor deposition (PVD)

FIG. 1 shows a conventional system. The system includes a heated source boat 100, containing the material to be deposited, the substrate 102, and masks 104 and 105 which restrict the material vapor to paths 103 and the region between.

Color filter arrays can be fabricated using evaporated pigment by a method which does not involve standard PVD techniques; which does not involve the use of a receiving layer on the first substrate; and which does not require physical contact between the pigment layer to be transferred and the first substrate during transfer, as shown in FIGS. 2 and 3A–3I.

Figure 2:
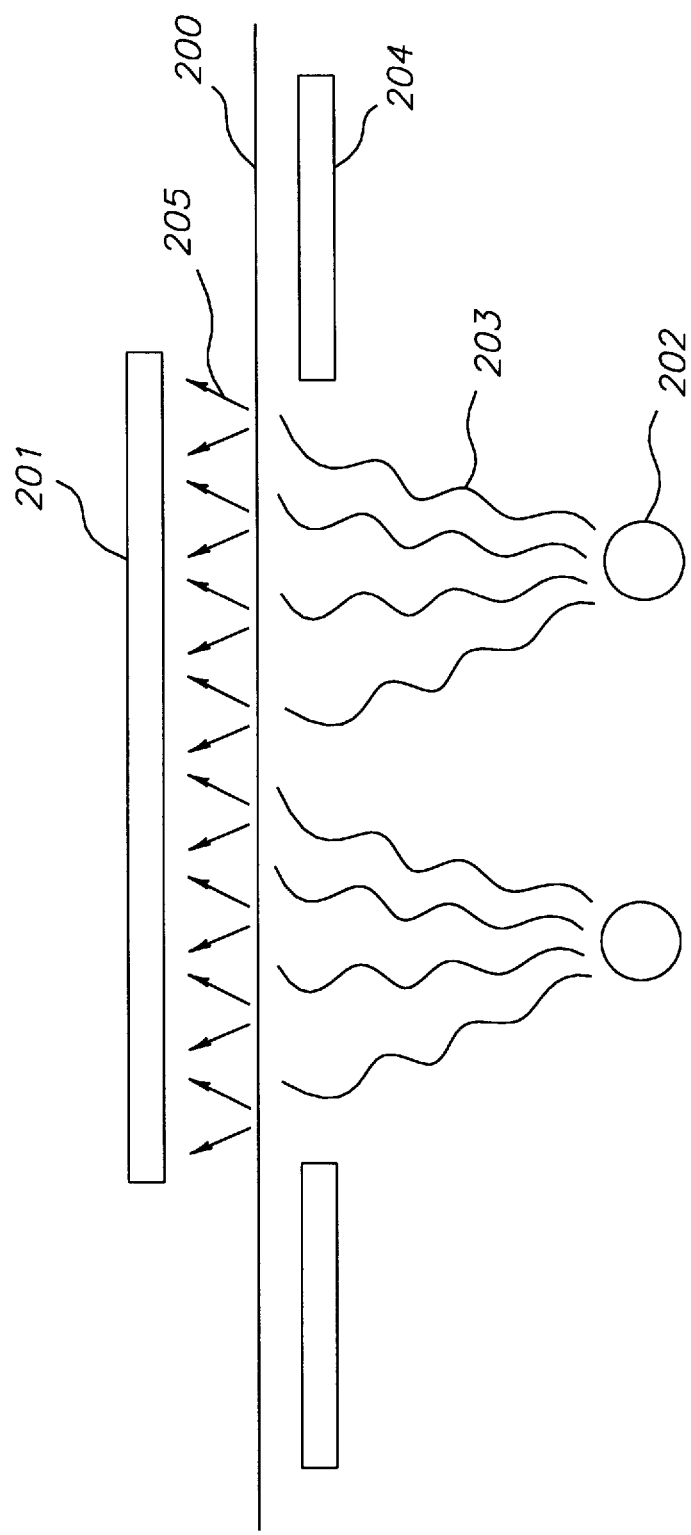
FIG. 2 shows a typical system for the thermal transfer of a pigment from a second substrate to a first substrate, according to the present invention.

FIG. 2 shows a system for the transfer of a material from the second substrate 200 onto the first substrate 201, as indicated by arrows 205, and which is promoted by heating with heat source 202, as indicated by radiant heat 203 acting through an aperture 204.

Figure 3A:
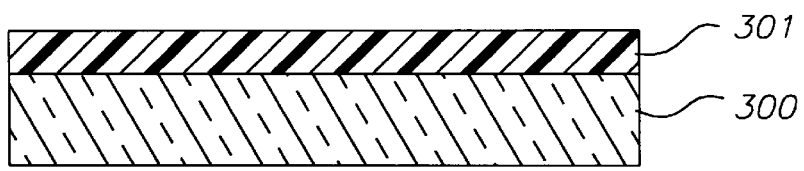
FIGS. 3A–3I show various steps in the method of making color filter arrays in accordance with the present invention.

Turning to FIG. 3A, first substrate 300 is shown on which has been formed an adhesion promoting layer 301. The first substrate 300 is formed from transparent materials such as glass or plastic, or it can be semiconductor material, such as in a device wafer in which is formed an image sensor. The adhesion promoting layer can be coated on the substrate by a number of techniques, including spin-coating, chemical vapor deposition, sputtering, or by vacuum deposition. The material used for the adhesion promoting layer 301 can be fonned from various materials, including an organic polymer, a spin-on-glass, or an inorganic material such as silicon oxide or silicon nitride. The adhesion promoting layer can be patterned to form an array of recesses in the adhesion promoting layer. Alternatively, the adhesion promoting layer 301 can be applied after the formation of the patterned intermediate layer 306, discussed below in FIG. 3E.

Figure 3B:
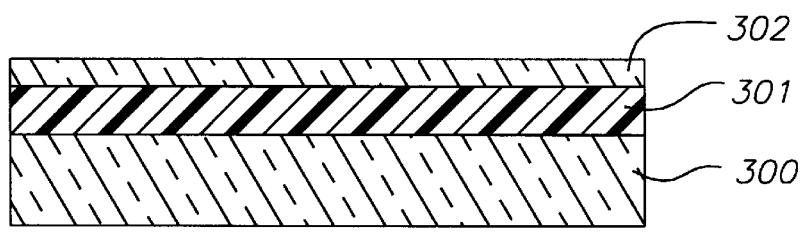

As shown in FIG. 3B, an intermediate layer 302 is formed on the adhesion promoting layer 301. The intermediate layer can be formed by a number of techniques, including spin-coating, chemical vapor deposition, sputtering, or vacuum deposition. The intermediate layer can be formed from various materials, including spin-on-glass, organic polymers, photoresists, or silicon-containing polymers. In addition, inorganic materials can be used such as silicon oxide or silicon nitride.

Figure 3C:
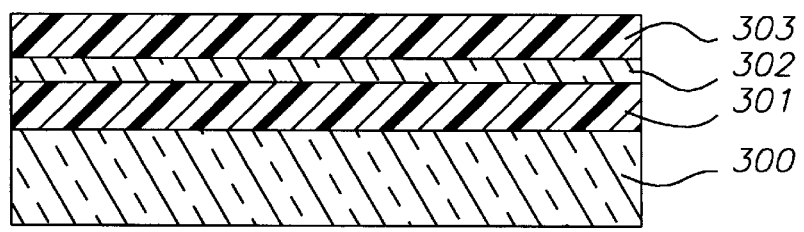

As shown in FIG. 3C, a photoresist layer 303 is formed on the intermediate layer 302. The photoresist layer can be formed from a single photoresist, which is typically formed by spin-coating, as is well known in the art, or it can be formed by a plurality of layers including a photoresist layer coated on another material which can be etched in an etching step, such as spin-on-glass or silicon oxide. The etchable material can be coated by a variety of techniques, including spin-coating, vacuum deposition, sputtering, or chemical vapor deposition.

Figure 3D:
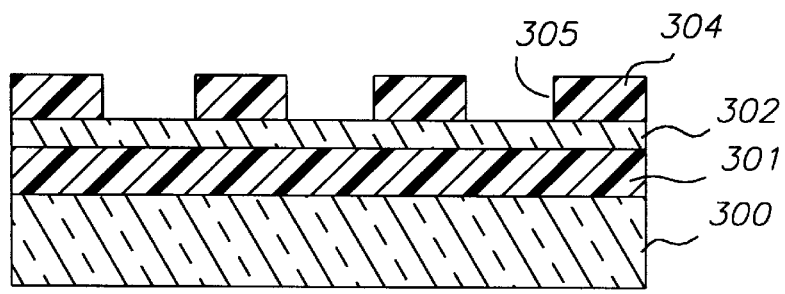

As in shown in FIG. 3D, the photoresist layer 303 is exposed and developed to form the patterned photoresist layer 304 with an array of first openings 305. In the case in which the photoresist layer is includes a plurality of layers, the layers are chosen such that the upper layer can be patterned and then used as a mask for an etching step to etch the layers underneath to form an array of openings in the photoresist layer.

Figure 3E:
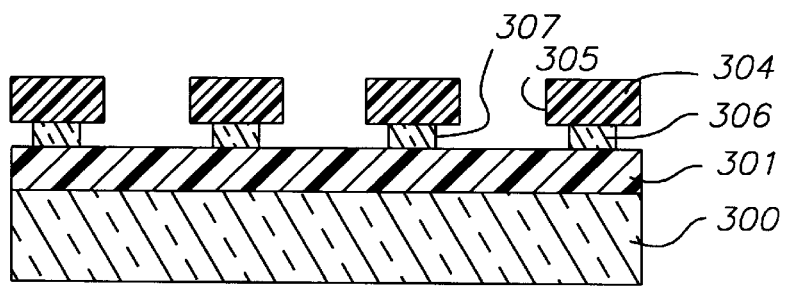

As shown in FIG. 3E, the intermediate layer 302 is etched, using the patterned photoresist layer 304 as a mask, to form the patterned intermediate layer 306 with an array of second openings 307 which are wider than the openings in the patterned photoresist layer 304. In the case in which the intermediate layer is formed of an inorganic material such as silicon oxide or silicon nitride, the etching step can be performed with a solution etch or a plasma etch. In the case in which the intermediate layer is formed from a photoresist or organic polymer, the etching step can be performed by a development step, as in known in the art for photoresist, or it can be performed by a dissolution step with solvent appropriate for the polymer material, or it can be performed by gas-phase processes such as plasma etching or reactive ion etching.

Figure 3F:
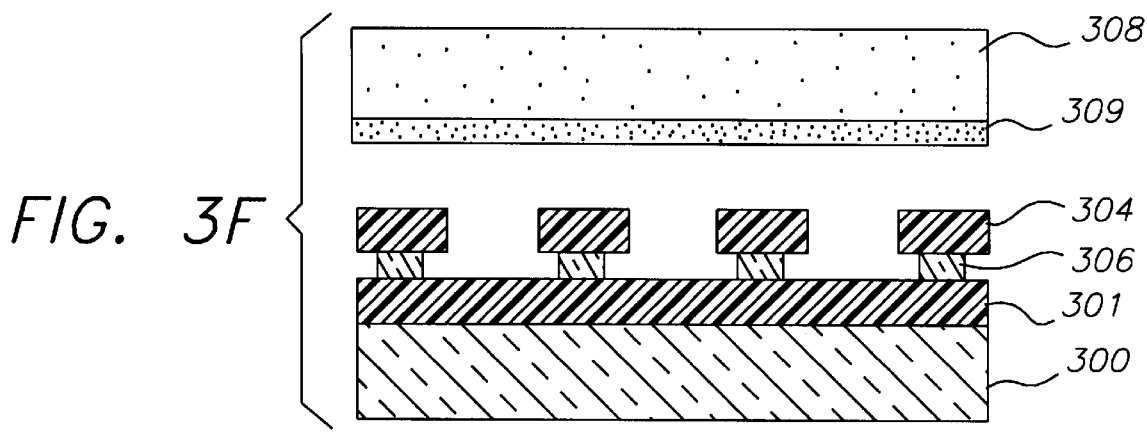

As shown in FIG. 3F, a second substrate 308 is shown upon which has been deposited a uniformly thick pigment layer 309, and the second substrate 308 is shown with the pigment layer 309 in transferable relationship with the patterned photoresist layer 304 on the first substrate 300. In order the make the pigment layer uniformly thick, pigment can be deposited on the second substrate by a number of techniques, including physical vapor deposition, vacuum deposition, vacuum evaporation, or sublimation. The pigment is preferably selected from materials which are not dissolved or dispersed by the solvent used for the lift-off of the photoresist, as given in FIG. 3H. It is advantageous for the pigment to be selected from those which form layers which are permeable to the lift-off solvent.

Figure 3G:
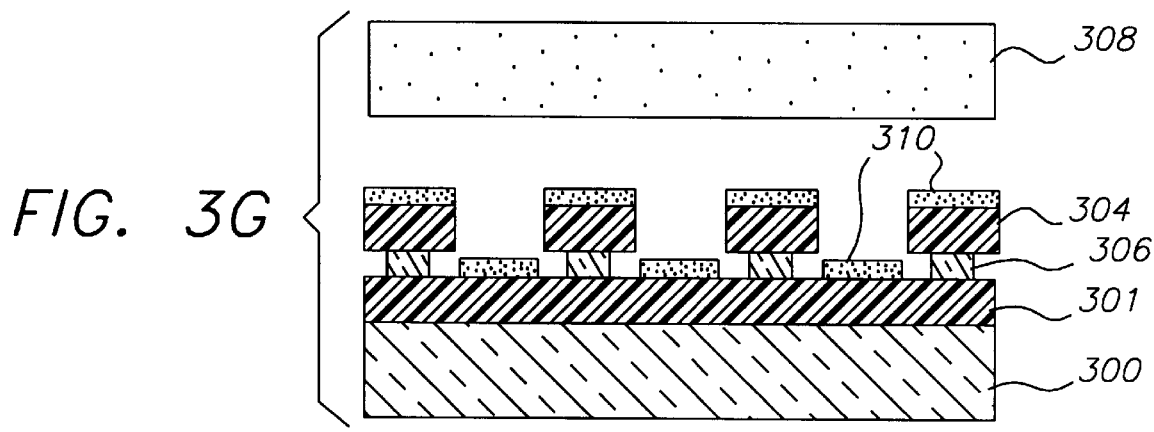

As shown in FIG. 3G, the pigment has been transferred from the second substrate 308 to the patterned photoresist 304 on the first substrate 300, to form the transferred pigment layer 310. In order to provide this transfer, heat is applied to the second substrate 308. Typically, the substrate is composed of metals, such as steel or aluminum or of a temperature-resistant plastic such as a polyimide film. Heating be accomplished by exposing the non-coated side of the second substrate 308 to electromagnetic radiation of wavelengths which are absorbed by the substrate or by the pigment layer and are converted into heat by radiationless decay processes. The electromagnetic radiation may be applied over a large area simultaneously as from an extended lamp source, or it may be applied as a scanned beam as with a laser. It will be appreciated that imagewise light exposure may be used to heat and transfer only a portion of the pigment layer. Another method used to heat the second substrate 308 in order to transfer the pigment layer 309 is to pass an electric current through the second substrate, particularly when it is composed entirely or partially of metal. In still another method, the second substrate may be heated by direct contact with an object such as a metal block, a high temperature roller, or other such devices which can be heated or pre-heated to the required temperature and which can transfer heat to the substrate by direct thermal contact. Typical distances and pressures for the transfer of colorant are from about 0.1 mm to about 3 mm at pressures of less than or equal to about 0.1 Torr, up to a distance of about 50 mm at pressures of less than 0.001 Torr.

Figure 3H:
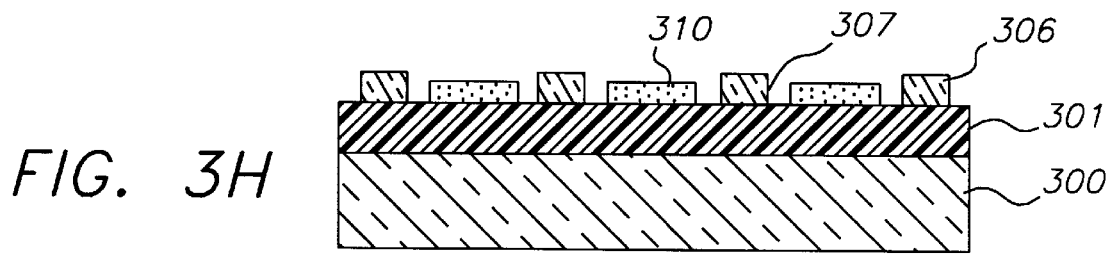

As shown in FIG. 3H, the patterned photoresist layer 304 has been removed along with the overlying transferred pigment layer 310 by a lift-off process, leaving the transferred pigment layer 310 in the second openings 307 in the patterned intermediate layer 306.

More detailed discussion of the lift-off process follows:

A photoresist layer is patterned by imagewise exposure to electromagnetic radiation of the appropriate wavelength, followed by development to open up areas where a subsequently deposited layer is desired. The subsequent layer is deposited on both the opened areas and the remaining photoresist, followed by the lift-off in which the photoresist is dissolved or swollen in a solvent, causing it to become detached from the underlying substrate, lifting-off to leave the desired deposit in place. A description of the lift-off process and typical materials used is given in Chapter 12 of *Semiconductor Lithography*, by W. M. Moreau, Plenum Press, N.Y., 1989.

Typically, in a lift-off process, the patterned photoresist layer 304 and any underlying patterned layers are removed together. An feature of the present invention is the removal of photoresist and overlying pigment only, leaving the patterned intermediate layer and the pigment in the openings in the intermediate layer. Another feature of this method is that the overlying pigment is permeable to the lift-off solvent. This results in a very rapid lift-off, since the lift-off solvent simultaneously penetrates the photoresist over its entire area to dissolve or swell it rather that only penetrating it from its exposed edges, as is the case with overlying materials that are impermeable to the lift-off solvent. Once the patterned photoresist layer 304 is removed in the lift-off process, the intermediate layer can be removed in another very rapid step, as given in FIG. 3I.

Figure 3I:
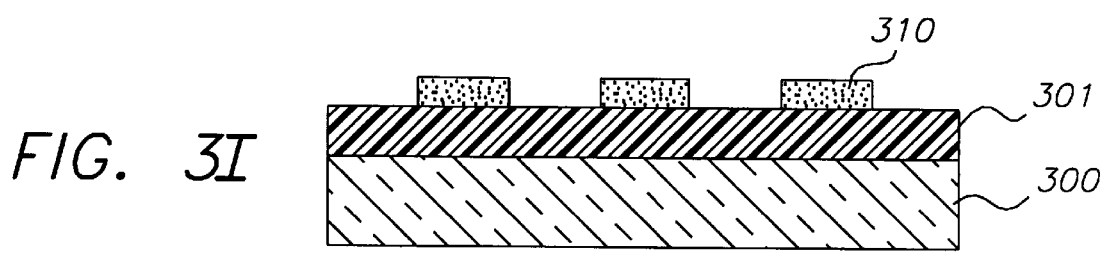

In FIG. 3I is shown the transferred pigment layer 310 after the patterned intermediate layer 306 has been removed. The patterned intermediate layer can be removed by a number of methods, including: a solution etch or plasma etch in the case of a spin-on-glass or silicon oxide or silicon nitride layer a solvent dissolution or a development step in the case of a photoresist layer, or a dissolution in the case of a polymer layer.

In the above discussion where various layers and substrates are described, it is appreciated that each layer and substrate can be provided by multiple layers. In addition, the pigment layer can be formed from multiple pigments, applied either singly or simultaneously.

Pigments which are useful in the processes shown in FIGS. 3A–3I include the following: phthalocyanines, such as Pigment Blue 15, nickel phthalocyanine, chloroaluminum phthalocyanine, hydroxyaluminum phthalocyanine, vanadyl phthalocyanine, titanyl phthalocyanine, and titanyl tetrafluorophthalocyanine; isoindolinones, such as Pigment Yellow 110 and Pigment Yellow 173; isoindolines, such as Pigment Yellow 139 and Pigment Yellow 185; benzimidazolones, such as Pigment Yellow 151, Pigment Yellow 154, Pigment Yellow 175, Pigment Yellow 194, Pigment Orange 36, Pigment Orange 62, Pigment Red 175, and Pigment Red 208; quinophthalones, such as Pigment Yellow 138; quinacridones, such as Pigment Red 122, Pigment Red 202, and Pigment Violet 19; perylenes, such as Pigment Red 123, Pigment Red 149, Pigment Red 179, Pigment Red 224, and Pigment Violet 29; dioxazines, such as Pigment Violet 23; thioindigos, such as Pigment Red 88 and Pigment Violet 38; epindolidiones, such as 2,8-difluoroepindolidione; anthanthrones, such as Pigment Red 168; isoviolanthrones; indanthrones, such as Pigment Blue 60; imidazobenzimidazolones, such as Pigment Yellow 192; pyrazoloquinazolones, such as Pigment Orange 67; ketopyrrolopyrroles, such as Pigment Red 254, Irgazin DPP Rubin TR, Cromophtal DPP Orange TR, and Chromophtal DPP Flame Red FP (all of Ciba Pigments); and bisaminoanthrones, such as Pigment Red 177.

EXAMPLES

In accordance with the above-stated invention, the following have been performed.

Example 1

Commercially obtained copper phthalocyanine which had been purified by vacuum sublimation was heated by passing electrical current through the tantalum source boat 100 which contained it, while maintaining a reduced pressure of approximately $6 \times 10^{-5}$ Torr in a vacuum bell jar. About 0.2 microns of the phthalocyanine were deposited onto a section of type 304 stainless steel foil (Atlantic Metals and Alloys, Inc.), having a thickness of about 25 microns. The coated foil was then mounted about 3 mm distant from a silicon wafer which had a surface of about 0.5 microns of silicon oxide, and which had been spin-coated with poly(methyl glutarimide), SF-13 "PMGI" from Microlithographic Chemical Corp., to give a layer of about 1 micron thickness after baking at 250° C. for 45 sec., spin-coated with photoresist AZ5214IR (Hoechst Celanese Corp.) to give about 1.3 microns thickness after baking at 90° C. for 60 sec., patternwise exposed on a GCA Series 6300 step-and-repeat exposure tool with about 38 mJ/cm² of 365 nm light, baked on a hot plate at 120° C. for 40 sec., flood exposed with about 250 mj/cm$^2$ of light, and developed with AZ327 MIF developer (Hoechst Celanese Corp.) for 3 min. to give a patterned photoresist layer. The non-coated side of the foil was positioned about 25 mm from an array of 4 heat lamps (General Electric, Part no. QH500T3/CL) spaced about 30 mm apart. The assembly was subjected to a vacuum of about 6×10$^{-5}$ Torr and the heat lamps were powered at 120 V and 4A for 60 sec. to transfer the phthalocyanine to the silicon wafer. The wafer was removed from the vacuum chamber and subjected to ultrasound in a tray of acetone for 90 sec., using a Branson Model 3200 ultrasonic bath. The photoresist was completely removed by this treatment, leaving intact the copper phthalocyanine features in the desired pattern.

Example 2

Commercially obtained copper phthalocyanine which had been purified by vacuum sublimation was heated by passing electrical current through the tantalum source boat 100 which contained it, while maintaining a reduced pressure of about 6×10$^{-5}$ Torr in a vacuum bell jar. About 0.2 microns of phthalocyanine were deposited onto a section of stainless steel foil, having a thickness of about 25 microns. The coated foil was then mounted about 3 mm distant from a glass substrate, and the foil was clamped between two electrodes. The assembly was subjected to a vacuum of about 0.1 Torr, and electric current was passed through the foil (at 30 volts) for about 10 sec., causing the ends of the foil to reach a temperature of about 26° C. and the phthalocyanine to transfer to the glass substrate.

Example 3

A tantalum source boat 100 was half-filled with about 0.1 gm of Pigment Yellow 110 (Ciba-Geigy Corp.), placed under a partial vacuum of about 2.5×10$^{-5}$ Torr, and heated to a temperature of 375°–417° C. by passing an electric current through it. The material which evaporated from the source boat 100 was condensed on a section of stainless steel foil, about 25 microns thick, maintained at ambient temperature. The thickness of the deposit was monitored by an oscillating quartz crystal monitor, and was stopped when the thickness reached about 0.45 microns.

In a similar fashion, the steel foil previously coated with Pigment Yellow 110 was coated with about 0.15 microns of titanyl phthalocyanine (H.W. Sands Co.), at a pressure of about 2×10$^{-4}$ Torr and over a temperature range of 331°–437° C.

The double-coated steel foil was positioned about 2 mm from a glass slide, clamped between two electrodes, placed in a partial vacuum of about 3.3×10$^{-5}$ Torr, and heated by the passage of an electric current at 30 volts for 10 sec. All of the colorants were found to have transferred to the glass slide, giving a clear, continuous layer with an optical density above 3.0 at 695–715 nm. Attempts to mechanically separate the transferred colorants into distinct layers were unsuccessful.

Example 4

A similar procedure was followed as given in Example 3, except that the colorants were deposited in the reverse order. The colorants transferred completely to the glass slide, and appeared to form a clear, continuous layer.

Example 5

Commercially obtained titanyl phthalocyanine (Aldrich Chemical Co.) was placed in a tantalum source boat 100 and heated by passing electrical current through it, while maintaining a reduced pressure of about 1.1×10$^{-4}$ Torr in a vacuum bell jar. About 0.15 microns of the phthalocyanine were deposited onto a section of stainless steel foil, having a thickness of about 25 microns. The coated foil was used as the substrate for a second colorant layer in a second step, heating Pigment Orange 36 (Novoperm Orange HL-70 from Hoechst Celanese Corp.) in a tantalum source boat 100 at a pressure of about 1.3×10$^{-4}$ Torr. About 0.3 microns of the pigment were deposited on the phthalocyanine coating, forming a double-layer coating on the steel foil. The double-coated foil was then mounted about 2 mm distant from a section of a silicon wafer bearing an adhesion promoting layer of about 1.0 microns of poly(methyl glutarimide) (PMGI from Microlithographic Chemical Corp.) and a patterned layer of AZ5214IR photoresist (Hoechst Celanese Corp.), prepared as in Example 1, and the foil was clamped between two electrodes. The assembly was subjected to a vacuum of about 1.1×10$^{-4}$ Torr, and electric current was passed through the foil (at 30 volts) for about 10 sec. Both the phthalocyanine and the Pigment Orange 36 transferred to the wafer. The wafer was subjected to 30 sec. in acetone in an ultrasonic bath (Branson 2200) which removed the photoresist and the pigment which was on top of it, leaving pigment features in the desired locations on the wafer.

Example 6

Commercially obtained Pigment Blue 60 (Paliogen Blue L 6385, from BASF Corp.) was heated by passing electrical current through the tantalum source boat 100 which contained it, while maintaining a reduced pressure of approximately 1.0–1.6×10$^{-5}$ Torr in a vacuum bell jar. About 0.4 microns of Pigment Blue 60 was deposited onto a section of stainless steel foil, having a thickness of about 25 microns. The coated foil was then mounted about 3.5 mm distant from a silicon wafer which had a surface of about 0.5 microns of silicon oxide which had been spin-coated and baked to give about 1 micron of poly(methyl glutarimide), "PMGI" from Microlithographic Chemical Corp., and then spin-coated and baked to give about 1.3 microns of photoresist AZ5214IR (Hoechst Celanese Corp.), as described in Example 1. The photoresist was subsequently patterned and developed, as in Example 1, and the non-coated side of the foil was positioned about 25 mm from an array of 4 heat lamps (General Electric, Part no. QH500T3/CL) spaced about 30 mm apart. The assembly was subjected to a vacuum of about 1.4×10$^{-5}$ Torr and the heat lamps were powered at 120 V and 4 A for 60 sec. to transfer the pigment to the silicon wafer. The wafer was removed from the vacuum chamber and subjected to ultrasound in a tray of 30:70 (v/v) acetone in isopropyl alcohol for 90 sec., using a Branson Model 3200 ultrasonic bath. The photoresist was completely removed by this treatment, leaving intact the pigment features in the desired pattern. Microscopically, it could be seen that some of the unwanted pigment had not been removed from between the pigment elements.

Example 7

A silicon wafer having a layer of about 0.5 microns of silicon oxide on its surface was spin-coated at 3500 RPM with poly(methyl glutarimide), SF-13 "PMGI" from Microlithographic Chemicals Corp., and then baked at 250° C. for 45 sec. on a hot plate to give a layer thickness of about 1.1 microns. Then a layer of spin-on-glass (Accugaiss 211 from Allied-Signal Advanced Materials) was spin-coated at 2500 RPM to give a layer thickness of about 0.2 microns.

The wafer was then baked at 185° C. for 2 min. before being spin-coated at 2500 RPM with photoresist AZ5209E (Hoechst Celanese Corp.) to give a layer thickness of about 1.2 microns after baking at 90° C. for 60 sec. The photoresist was subsequently patterned by exposing to about 50 mJ/cm$^2$ on a GCA Series 6300 step-and-repeat exposure tool and developing for 60 sec. in AZ327 MIF developer (Hoechst Celanese Corp.). The wafer was then subjected to 2 min. in 30:1 Buffered Oxide Etch (Olin Microelectronics Materials) to etch the spin-onglass. When the wafer was cleaved and viewed in cross-section by scanning electron microscopy it was seen that the photoresist layer extended beyond the spin-on-glass layer by about 1.0 micron.

Example 8

Commercially obtained Pigment Blue 60 (Paliogen Blue L 6385 from BASF Corp.) was heated by passing electrical current through the tantalum source boat 100 which contained it, while maintaining a reduced pressure of approximately 1.4–1.8×10$^{-5}$ Torr in a vacuum bell jar. About 0.4 microns of the pigment were deposited onto a section of stainless steel foil, having a thickness of about 25 microns. The coated foil was then mounted about 3.5 mm distant from the silicon wafer described above. The non-coated side of the pigment-coated foil was positioned about 60 mm from an array of heat lamps (General Electric, Part no. QH500T3/CL) spaced about 30 mm apart. The assembly was subjected to a vacuum of about 2.6×10E-5 Torr and the heat lamps were powered for 60 seconds to transfer the pigment to the silicon wafer. The water was removed from the vacuum chamber and subjected to ultrasound in a tray of 30/70 (v/v) acetone in isopropyl alcohol for 2 min., completely removing the unwanted pigment, as seen by optical microscopy. The spin-on glass was then removed by soaking in an aqueous solution of 30:1 Buffered Oxide Etch (Olin Microelectronics Materials), for 2 min., leaving intact the Pigment Blue 60 features in the desired pattern.

The foregoing description as illustrated the embodiments most preferred by the inventors. While these are the best modes envisioned by the inventors obvious variations will be apparent to those skilled in the art. Therefore, the invention should not be limited to the embodiments detailed above, but should be defined by the appended claims.

PARTS LIST

100 source boat
102 substrate
103 paths
104 mask
105 mask
200 second substrate
201 first substrate
202 heat source
203 radiant heat
204 aperture
205 arrows
300 first substrate
301 adhesion promoting layer
302 intermediate layer
303 photoresist layer
304 patterned photoresist layer
305 first openings
306 patterned intermediate layer
307 second openings
308 second substrate
309 pigment layer
310 transferred pigment layer

What is claimed is:

1. A method of making a color filter array of uniformly thick organic pigments on a first substrate, comprising:

a) coating an adhesion promoting layer over the first substrate;

b) coating the adhesion promoting layer with an intermediate layer;

c) coating the intermediate layer with a photoresist layer;

d) exposing and developing the photoresist layer to form an array of first openings;

e) etching the intermediate layer, using the photoresist layer as a mask, to form an array of second openings in the intermediate layer which are wider than the corresponding first openings in the photoresist layer;

f) depositing an organic pigment layer on the photoresist layer;

g) lifting off the photoresist layer and overlying organic pigment layer; and h) removing the intermediate layer, leaving the organic pigment layer in the position of the second openings.

2. The method of claim 1 wherein the organic pigment layer is heat transferable and wherein step f) further includes the steps of depositing at least one such heat transferable organic pigment layer over a second substrate, positioning the deposited heat transferable organic pigment layer in transferable relationship with but spaced from the photoresist layer on the first substrate, and heating the deposited heat transferable organic pigment layer sufficiently to cause organic pigment to transfer to the photoresist layer.

3. The method of claim 1 wherein the intermediate layer includes spin-on glass, silicon oxide, silicon nitride, or silicon oxynitride.

4. The method of claim 1 wherein the etching step is provided by a plasma, solution, or dry etch.

5. The method of claim 1 wherein the intermediate layer has a thickness in a range of from 0.05 to 0.5 times the thickness of the photoresist layer.

6. The method of claim 1 wherein the adhesion promoting layer includes a polymer that is not dissolvable during the etching step when a solution etch is used.

7. The method of claim 1 wherein the organic pigment layer is permeable to the solvents used in the lifting-off step.

8. The method of claim 1 wherein the transfer of the organic pigment layer is performed at pressures from of less than or equal to about 0.1 Torr at a distance of from about 0.1 to about 3 mm.

9. The method of claim 1 where the transfer of the organic pigment layer is performed at pressures of less than or equal to about 0.001 Torr at a distance up to about 50 mm.

* * * * *